(12) United States Patent
Liu

(10) Patent No.: US 8,357,987 B2
(45) Date of Patent: *Jan. 22, 2013

(54) CHIP PACKAGE AND FABRICATION METHOD THEREOF

(76) Inventor: Chien-Hung Liu, Taipei (TW)

( * ) Notice: Subject to any disclaimer, the term of this patent is extended or adjusted under 35 U.S.C. 154(b) by 72 days.

This patent is subject to a terminal disclaimer.

(21) Appl. No.: 12/858,507

(22) Filed: Aug. 18, 2010

(65) Prior Publication Data

US 2011/0042781 A1 Feb. 24, 2011

Related U.S. Application Data

(60) Provisional application No. 61/235,159, filed on Aug. 19, 2009.

(51) Int. Cl.
*H01L 23/488* (2006.01)
(52) U.S. Cl. ........... 257/507; 257/734; 257/E21.499; 257/620; 257/E21.599; 257/E23.023; 257/E23.116
(58) Field of Classification Search ........... 257/507, 257/734, E21.499, 620, E21.599, E23.023, 257/E23.116
See application file for complete search history.

(56) References Cited

U.S. PATENT DOCUMENTS

| 2005/0051883 | A1* | 3/2005 | Fukazawa | 257/686 |
| 2010/0171189 | A1* | 7/2010 | Liu | 257/417 |
| 2010/0187697 | A1* | 7/2010 | Tsai et al. | 257/773 |
| 2011/0042807 | A1* | 2/2011 | Liu et al. | 257/737 |

* cited by examiner

*Primary Examiner* — Long Pham
(74) *Attorney, Agent, or Firm* — Birch, Stewart, Kolasch & Birch, LLP

(57) ABSTRACT

The invention is related to a chip package including: a semiconductor substrate having at least one bonding pad region and at least one device region, wherein the semiconductor substrate includes a plurality of heavily doped regions in the bonding pad region, and two of the heavily doped regions are insulatively isolated; a plurality of conductive pad structures disposed over the bonding pad region; at least one opening disposed at a sidewall of the chip package to expose the heavily doped regions; and a conductive pattern disposed in the opening to electrically contact with the heavily doped region.

13 Claims, 7 Drawing Sheets

CHIP PACKAGE AND FABRICATION METHOD THEREOF

CROSS REFERENCE TO RELATED APPLICATIONS

This application claims the benefit of U.S. Provisional Application No. 61/235,159 filed on Aug. 19, 2009, the entirety of which is incorporated by reference herein.

BACKGROUND OF THE INVENTION

1. Field of the Invention

The present invention relates to a chip package, and in particular relates to a wafer level chip package and a fabrication method thereof.

2. Description of the Related Art

A wafer level packaging technique for chip packaging has been developed. A wafer level package is first completed and then a dicing step is performed to form separate chip packages. A redistribution pattern in a chip package is mainly designed to be in direct contact with a metallic bonding pad. Thus, the process for forming the redistribution pattern must correspond with the design of the metallic bonding pad.

Therefore, it is desired to have a novel chip package and a fabrication method thereof to address the above issues.

BRIEF SUMMARY OF THE INVENTION

An embodiment of the invention provides a chip package, comprising: a semiconductor substrate having at least one bonding pad region and at least one device region, wherein the semiconductor substrate comprises a plurality of heavily doped regions in the bonding pad region, and two of the heavily doped regions are insulatively isolated; a plurality of bonding pad structures disposed over the bonding pad region; at least one opening disposed at a sidewall of the chip package to expose the heavily doped regions; and a conductive pattern disposed in the opening to electrically contact with the heavily doped regions.

In addition, an embodiment of the invention provides a method for fabricating a chip package, comprising: providing a semiconductor wafer defined with a plurality of scribe line regions, bonding pad regions, and device regions; performing an ion implanting process to form a plurality of heavily doped regions in the bonding pad regions; forming a plurality of conductive pad structures over the bonding pad regions, wherein the conductive pad structures correspond to the heavily doped regions; forming a plurality of openings along the scribe line regions to expose the heavily doped regions; and forming a conductive pattern in the openings to electrically contact with the heavily doped regions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
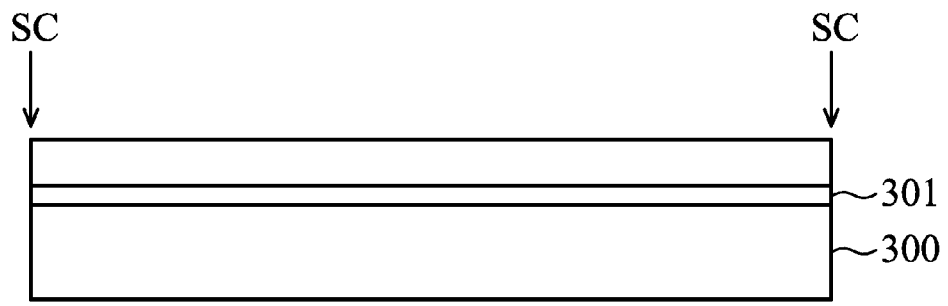
FIGS. 1-2 show illustrative cross sections of a method for fabricating a semiconductor chip according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The following description is of a mode for carrying out the invention. Whenever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. This description is made for the purpose of illustrating the general principles of the invention and should not be taken in a limiting sense.

Embodiments of the invention may be applied to a complementary metal-oxide-silicon (CMOS) image sensing chip package, or in other embodiments, electronic components with active or passive devices, or with digital or analog circuits, or optoelectronic devices, micro electro mechanical systems (MEMS), micro fluidic systems, and physical sensors for detecting heat, light, or pressure. Particularly, a wafer level packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

Figure 2:
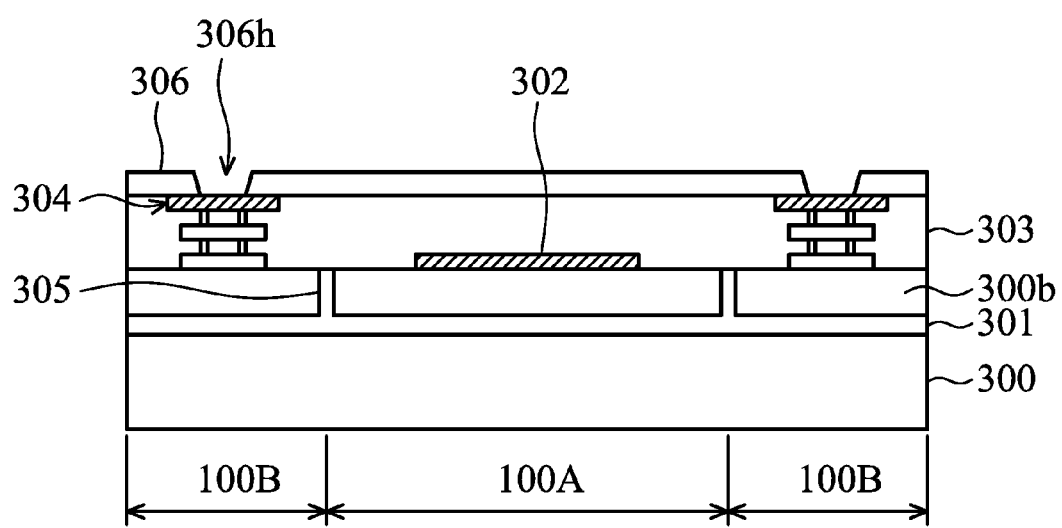

FIG. 1 and FIG. 2 are cross sections showing a method for fabricating a chip using a semiconductor wafer according to an embodiment of the invention. As shown in FIGS. 1 and 2, a semiconductor wafer 300, typically a silicon wafer, is first provided with an insulating layer 310 which can be formed by processes such as thermal oxidation or chemical vapor deposition processes. In one embodiment, the semiconductor wafer 300 can be a silicon-on-insulator (SOI) substrate, or can be formed by combining two wafers together by wafer bonding, wherein one of the wafers has an insulating layer. The semiconductor wafer is defined with a plurality of scribe line regions SC corresponding to chips and a plurality of substrates, and each of the substrates comprises at least one device region 100A and a peripheral bonding pad region 100B surrounding the device region 100A. Next, an insulating wall 305 extending to the insulating layer 301 is formed in the semiconductor wafer 300 to isolate the plurality of regions in the peripheral bonding pad regions 100B as heavily doped regions 300b. A semiconductor device 302 such as an image sensor element or micromechanical electronic structure is fabricated in the device region 100A, and an intermetal dielectric (IMD) layer 303 covers the semiconductor wafer 300 and the semiconductor device 302. Generally, low k insulating materials such as a porous oxide layer may be selected as the intermetal dielectric layer 303. Next, a plurality of conductive pad structures 304 are fabricated in the intermetal dielectric layer 303 in the peripheral bonding pad regions 100B. The insulating wall and the insulating layer can be insulating materials such as conventional silicon nitride, or an insulating space such as a gas-sealed layer or a vacuum isolation layer. The conductive pad structures 304 may be preferably formed of Cu, Al or other suitable metal materials. It is noted that the semiconductor wafer may comprise a plurality of heavily doped regions 300b in the peripheral bonding pad regions 100B, which electrically contact the conductive pad structures 304 and are isolated by the insulating wall 305. The heavily doped regions 300b can be formed by doping ions of high concentrations such as phosphors or arsenics ions of a doping concentration of $1E^{14}$-$6E^{15}$ atoms/$cm^2$ by, for example, diffusion or ion implanting steps, to form a conductive path. In one embodiment, one of the heavily doped regions corresponds to one of the conductive pad structures. However, when a plurality of conductive pad structures are used as a common output, one of the heavily doped regions may correspond to a plurality of conductive pad structures at the same time.

In addition, the semiconductor wafer 300 is typically covered by a passivation layer 306 when fabricated and devices of chips are electrically connected to an outer circuit. Conventionally, the passivation layer 306 may be pre-defined by manufacturers to form openings 306h for exposing the conductive bond structures 304.

Figure 3A:
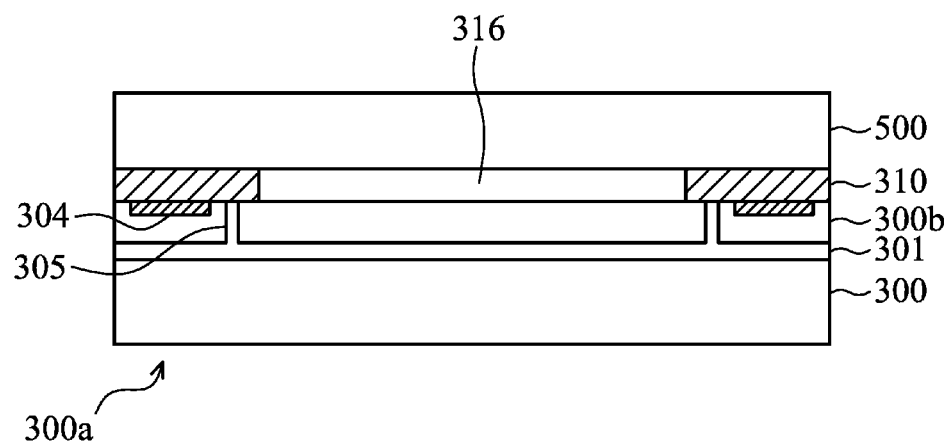
FIGS. 3A-3F show illustrative cross sections of a method for fabricating a chip package according to another embodiment of the invention.

Next, as shown in FIG. 3A, a packaging layer 500 is provided and then bonded to the semiconductor wafer. For the semiconductor wafer 300, only the conductive pad structures 304, the insulating walls 305 and the insulating layer 301 are disclosed for brevity. The packaging layer 500 can be a transparent substrate made of glass, another blank silicon wafer, or another wafer comprising integrated circuit devices. In one embodiment, the packaging layer 500 and the semiconductor wafer may be separated by a spacer layer 310, which when formed, simultaneously forms a cavity 316. The spacer layer 310 can be sealing adhesives or photosensitive insulating materials such as an epoxy, or a solder mask. In addition, the spacer layer 310 can be first formed over the semiconductor wafer 300 and then bonded to the opposing packaging layer 500 by adhesives. On the contrary, the spacer layer 310 can be first formed over the packaging layer 500 and then bonded to an opposing semiconductor wafer 300 by adhesives.

Figure 3B:
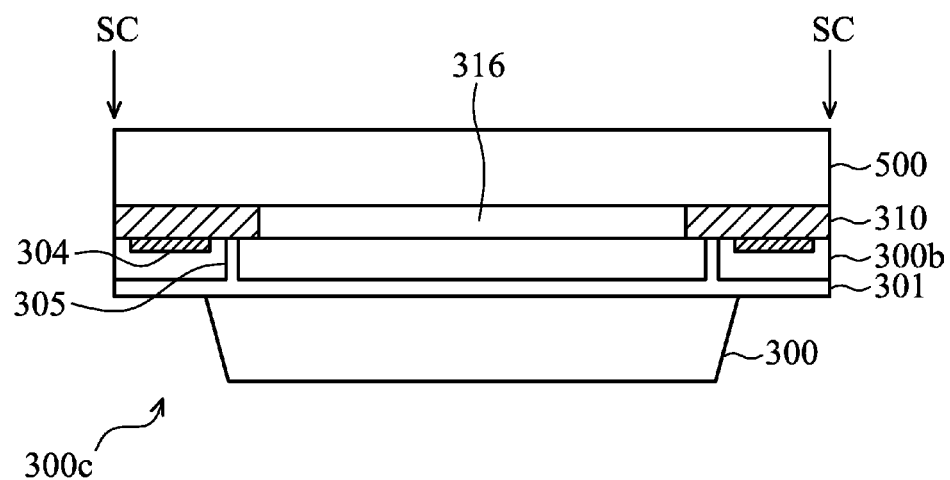

Referring to FIG. 3B, the packaging layer 500 in this embodiment may serve as a carrier substrate for an etching process performed on a backside 300a of the semiconductor wafer along the scribe line region SC. For example, a portion of the silicon substrate is removed by a process such as an anisotropic etching process to form openings 300c therein, expose portions of the surface of the insulating layer 301 and divide the semiconductor wafer into a plurality of substrates.

Figure 3C:
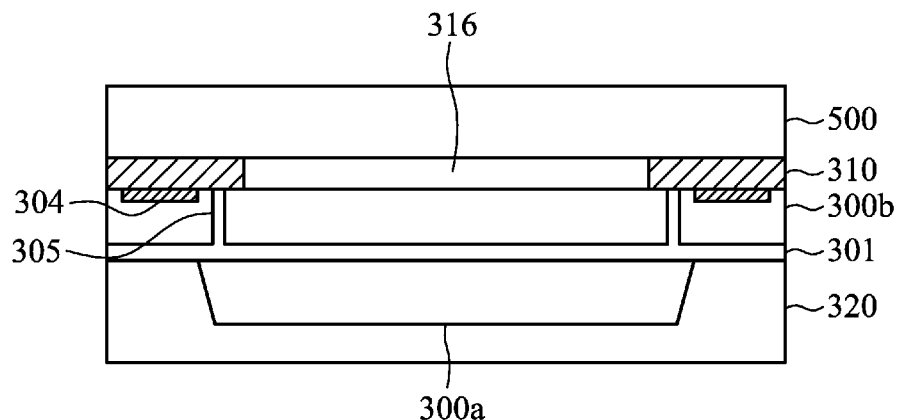

Referring to FIG. 3C, a planar insulating layer 320 is blanketly formed on the backside 300a of the semiconductor wafer to fill the openings 300c. The insulating layer 320 may be made of epoxy, solder mask, or other suitable insulating materials such as inorganic silicon oxide layer, silicon nitride, silicon oxynitride, metal oxide, or combinations thereof, or can be made of organic polymer materials such as polyimide, butylcyclobutene (BCB, product of Dow chemicals), parylene, polynaphthalenes, fluorocarbons and acrylates.

Figure 3D:
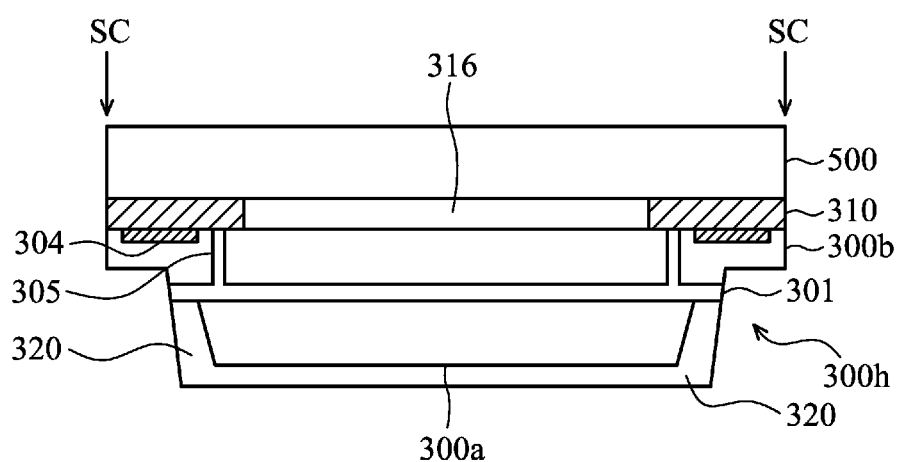

Next, referring to FIG. 3D, portions of the insulating layer 320, the insulating layer 301 and portions of the heavily doped regions 300b are removed from the backside 300a of the semiconductor wafer to form a notch opening 300h. For example, a notching process can be performed on the backside 300a of the semiconductor wafer along the scribe line SC to thereby remove portions of the insulating layer 320, the insulating layer 301 and portions of the heavily doped regions 300b by a cutter. The notch openings 300h are thus formed in the semiconductor wafer 300 to expose each of the heavily doped regions 300b as each of the notch openings 300h is formed on a sidewall of the chip package.

Figure 3E:
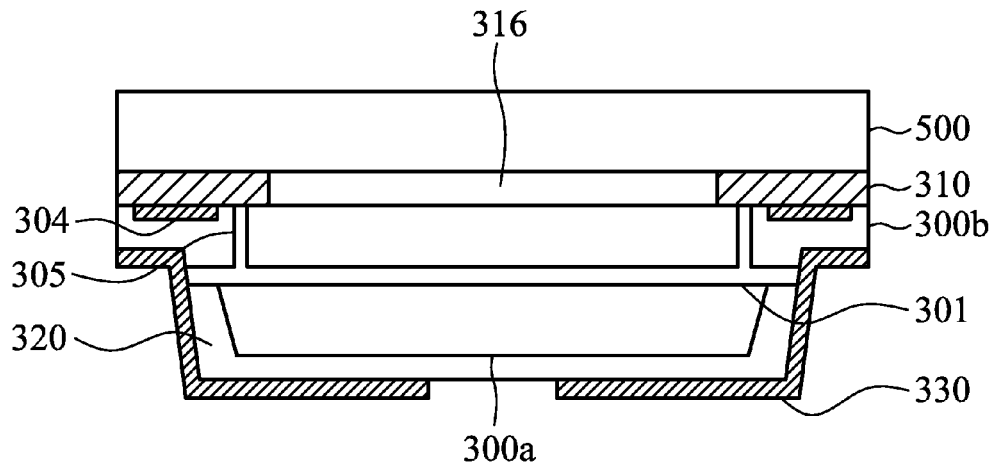

Next, as shown in FIG. 3E, a redistribution pattern 330 is formed in the notch opening 300h. In this embodiment, the redistribution pattern 330 is not only formed on a sidewall of the notch opening 300h but also further extends to a bottom surface of the insulating layer 320 and over the heavily doped regions 300b. The redistribution pattern 330 can be formed by a physical vapor deposition, chemical vapor deposition, electroplating, or electroless plating process. The redistribution pattern 330 can be made of metal materials such as copper, aluminum, gold, or combinations thereof. The redistribution pattern 330 can be also formed of conductive oxides such as indium tin oxide (ITO), indium zinc oxide (IZO) or combinations thereof. In one embodiment, a conductive layer is conformably formed over the entire semiconductor wafer 300 and a photolithography process is performed to pattern the conductive layer to form the redistribution pattern corresponding to each of the heavily doped regions 300b.

Figure 3F:
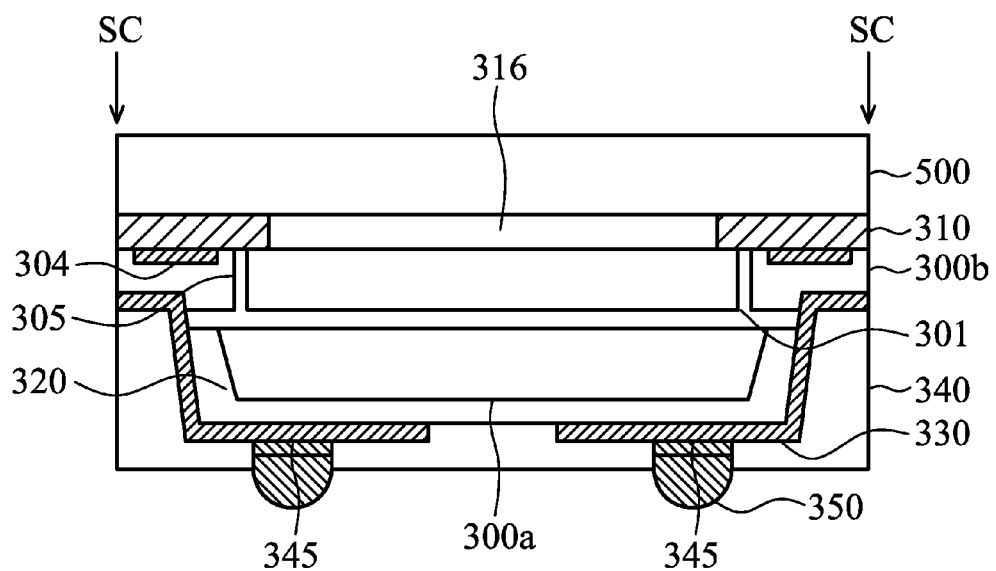

Next, referring to FIG. 3F, a method for forming the passivation layer 340 is illustrated. In one embodiment of the invention, the passivation layer 340 may be, for example, a solder mask. The passivation layer 340 may be formed on the backside 300a of the semiconductor substrate by a method, such as, a solder material coating process. Next, a patterning process is performed on the passivation layer 340 to form terminal contact openings exposing a portion of the redistribution patterns 330. Next, under bump metallurgy (UBM) layers 345 and conductive bumps 350 are formed at the terminal contact openings. For example, the UBM layers may be formed by conductive materials such as metals or metal alloys such as Ni layers, Ag layers, Al layers, Cu layers or alloys thereof, or materials of doped polysilicon, monocrystalline silicon or conductive glasses. Additionally, refractory metal materials such as titanium, molybdenum, chromium or titanium tungsten layers can be used to individually form the UBM layers or be combined with other metal layers. In a specific embodiment, an Ni/Ag layer may be formed on a portion of a surface or the entire surface of the metal layer. The conductive bumps 350 may be electrically connected to the heavily doped regions 300b by the redistribution patterns 330 but not by the conductive pad structures 340. In the embodiment of the invention, the conductive bumps serve to transmit input/output (I/O) signals, ground signals, or power signals in the devices 302. Next, the semiconductor substrate 300 is cut along a scribe line region SC in the peripheral bonding pad region to form a plurality of divided chip packages. The semiconductor substrate in the chip packages are recessed inward, and the conductive patterns 330 and the semiconductor substrate are isolated by the insulating layer 320. The notch opening 300h is adjacent to the insulating layer 320 and is located on a sidewall of the chip package and is covered by the passivation layer 340.

In addition, the heavily doped regions 300b in the peripheral bonding pad regions are isolated by the insulating wall 305 and are not in direct contact with the conductive bonding pad structures 304. Therefore a bottom portion of the notch openings 300h does not have to be deeply extended to a location of the conductive pad structures and the spacer layer such that the chip packages are structurally stronger.

As shown in FIG. 3f, the notch openings 300h can be formed with a depth which exceeds the insulating layer 301 such that the redistribution pattern 330 in the notch opening can thus deeply extend into the heavily doped regions 300b to increase contact area. Namely, the insulating layer 301 can be disposed under the bottom portion of the notch openings 300h or thereunder.

Figure 4A:
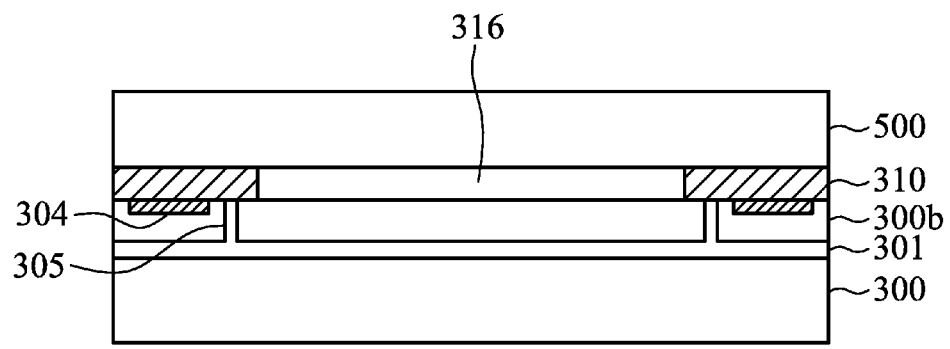
FIGS. 4A-4F show illustrative cross sections of a method for fabricating a chip package according to another embodiment of the invention.
Figure 4B:
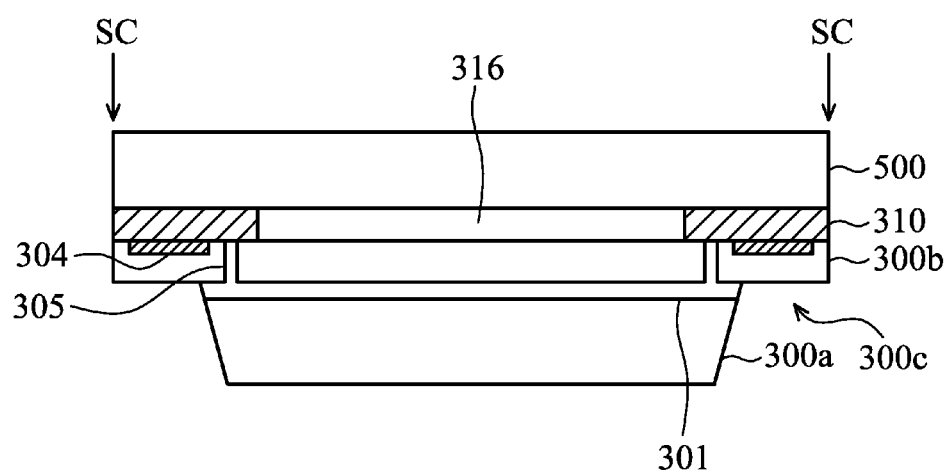
Figure 4C:
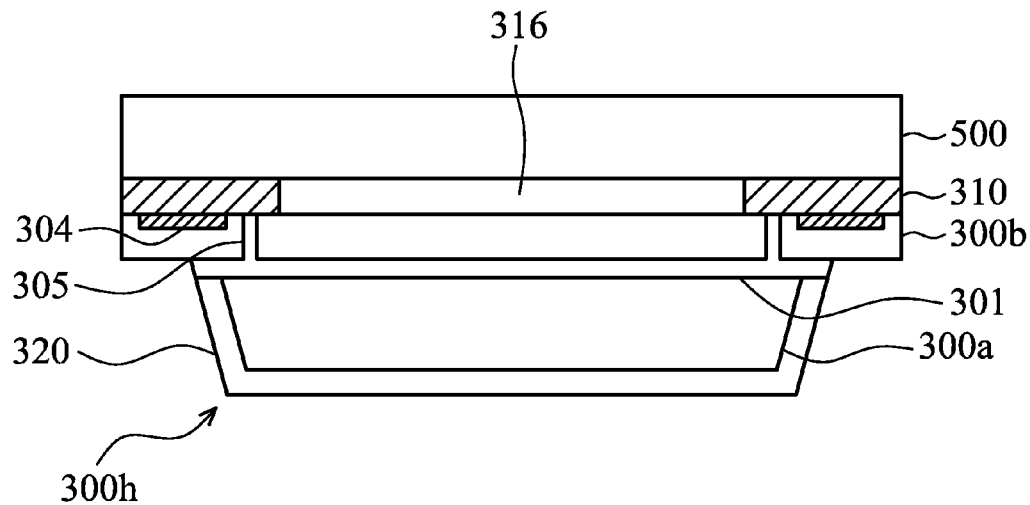

Referring to FIGS. 4A-4F, illustrative cross sections of a method for fabricating a chip package according to another embodiment of the invention are shown, wherein a primary difference with the previous embodiment is that the notch openings 300h are formed by an etching process and not a cutting process. First, as shown in FIG. 4a, the packaging layer 500 is first covered, and portions of the silicon substrate and portions of the insulating layer 301 on a backside 300a of the semiconductor wafer are removed along the scribe line region SC to expose the heavily doped regions 300b and to form the opening 300c, as shown in FIG. 4b. For example, an anisotropic etching process can be performed on a backside 300a of the semiconductor wafer along the scribe line region SC to sequentially remove portions of the silicon substrate and portions of the insulating layer 301 to form the openings 300c exposing each of the heavily doped regions 300b in the semiconductor wafer 300, which divide the semiconductor wafer into a plurality of substrates.

Next, as shown in FIG. 4, an insulating layer 320 is conformably formed on the backside 300a of the semiconductor wafer but does not fill the opening 300c. The insulating layer 320 can be made of materials such as epoxy, solder mask, or other suitable insulating materials. A photolithography process is performed to pattern the insulating layer 320 on the bottom portion of the opening to again expose the notch opening 300h of each of the heavily doped regions 300b.

Figure 4D:
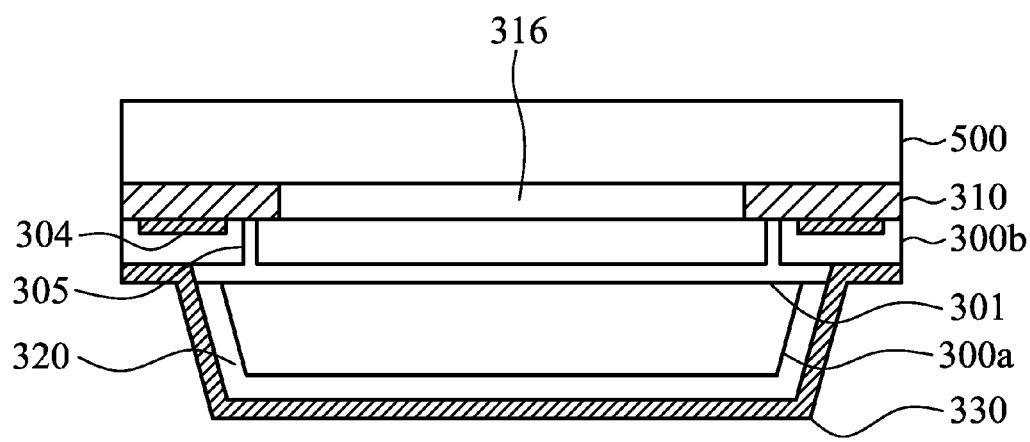
Figure 4E:
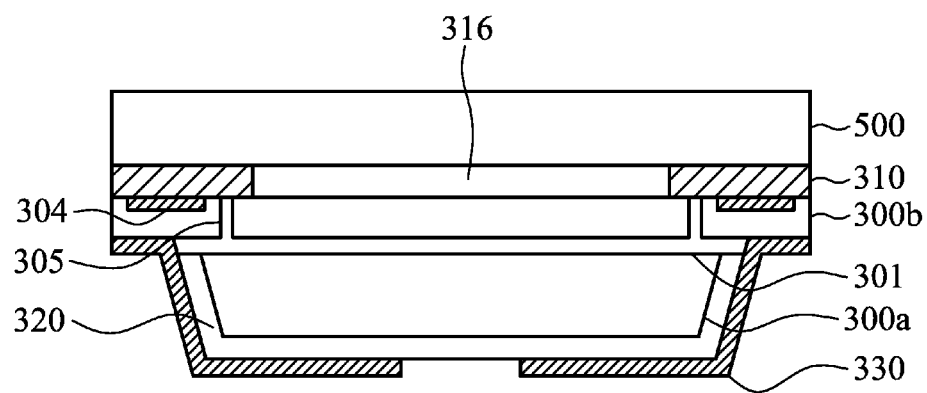
Figure 4F:
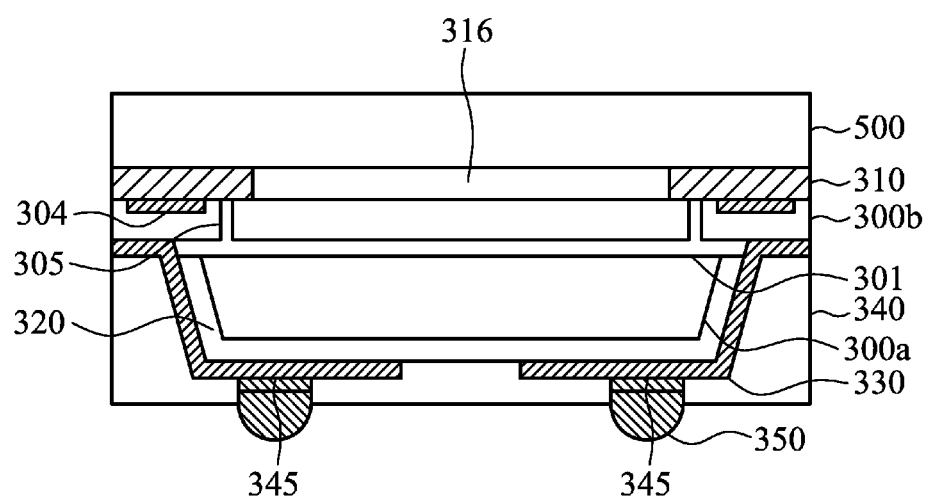

Referring to FIGS. 4D and 4E, a conductive layer is conformably formed over the entire semiconductor wafer 300 and then the conductive layer is patterned by a photolithography process to form a plurality of redistribution patterns 330 corresponding to the heavily doped regions. In this embodiment, the redistribution patterns are not only formed on sidewalls of the notch openings 300h but also extend to the bottom surface of the insulating layer 320 and the heavily doped regions 300b. Next, as shown in FIG. 4F, fabrication of the passivation layer 340 and the conductive bump 350 are sequentially performed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a semiconductor substrate having at least one bonding pad region and at least one device region, wherein the semiconductor substrate comprises a plurality of heavily doped regions in the bonding pad region, and two of the heavily doped regions are insulatively isolated;
    a plurality of bonding pad structures disposed over the bonding pad region;
    at least one opening disposed on a sidewall of the chip package to expose the heavily doped regions; and
    a conductive pattern disposed in the opening to electrically contact with the heavily doped regions.

2. The chip package as claimed in claim 1, wherein two of the heavily doped regions are isolated by an insulating wall.

3. The chip package as claimed in claim 2, wherein the semiconductor substrate further comprises an insulating layer, and the insulating wall extends to the insulating layer.

4. The chip package as claimed in claim 3, wherein the insulating layer extends to a bottom portion or a sidewall of the opening.

5. The chip package as claimed in claim 3, wherein the semiconductor substrate is a silicon-on-insulator substrate.

6. The chip package as claimed in claim 1, wherein the conductive pattern extends into the heavily doped regions.

7. The chip package as claimed in claim 1, wherein the semiconductor substrate comprises a first surface and an opposite second surface, and the conductive pad structures are located on the first surface and the opening is formed from the second surface.

8. The chip package as claimed in claim 1, wherein heavily doped regions are wider than the conductive pad structures.

9. The chip package as claimed in claim 1, wherein the semiconductor substrate is recessed inward, the conductive pattern and the semiconductor substrate are isolated by an insulating layer, and the opening is adjacent to the insulating layer.

10. The chip package as claimed in claim 1, further comprising a packaging layer covering the semiconductor substrate.

11. The chip package as claimed in claim 10, further comprising a spacer layer disposed between the packaging layer and the semiconductor substrate.

12. The chip package as claimed in claim 11, wherein the packaging layer comprises a silicon substrate or a transparent substrate.

13. The chip package as claimed in claim 1, further comprising a passivation layer filling the opening and covering the conductive pattern.

* * * * *